United States Patent
Nakamura et al.

(10) Patent No.: US 7,382,198 B2
(45) Date of Patent: Jun. 3, 2008

(54) DIFFERENTIAL AMPLIFIER CIRCUITRY FORMED ON SEMICONDUCTOR SUBSTRATE WITH REWIRING TECHNIQUE

(75) Inventors: Masanori Nakamura, Kyoto (JP); Iwao Kojima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 144 days.

(21) Appl. No.: 11/399,541

(22) Filed: Apr. 7, 2006

(65) Prior Publication Data

US 2006/0244540 A1    Nov. 2, 2006

(30) Foreign Application Priority Data

Apr. 12, 2005  (JP)  ............................ P2005-114345

(51) Int. Cl.
*H03F 3/45*  (2006.01)
(52) U.S. Cl. ....................... 330/307; 330/252
(58) Field of Classification Search .................. 330/307
See application file for complete search history.

(56) References Cited

U.S. PATENT DOCUMENTS 6,903,459 B2 *  6/2005  Nakatani .................... 257/758
7,193,463 B2 *  3/2007  Miyashita et al. .......... 330/252

FOREIGN PATENT DOCUMENTS

JP        2003-133862        5/2003

* cited by examiner

*Primary Examiner*—Steven J Mottola
(74) *Attorney, Agent, or Firm*—Wenderoth, Lind & Ponack, L.L.P.

(57) ABSTRACT

In differential amplifier circuitry formed on a semiconductor substrate, first and second transistors constitute a differential pair of the differential amplifier circuitry. First and second pads are connected with emitters of the first and second transistors, respectively. The first and second pads are connected with first and second external ground terminals via first and second rewiring layers to be grounded, respectively. The first and second rewiring layers are preferably connected with each other. Further, bases of the first and second transistors are connected with first and second bias circuits via first and second resistors, respectively.

8 Claims, 11 Drawing Sheets

FIRST PREFERRED EMBODIMENT

Fig. 1 FIRST PREFERRED EMBODIMENT

SECOND PREFERRED EMBODIMENT

THIRD PREFERRED EMBODIMENT

FOURTH PREFERRED EMBODIMENT

DIFFERENTIAL AMPLIFIER CIRCUITRY FORMED ON SEMICONDUCTOR SUBSTRATE WITH REWIRING TECHNIQUE

BACKGROUND OF THE INVENTION

1. Field of the Invention

The present invention relates to differential amplifier circuitry formed on a semiconductor substrate. In particular, the present invention relates to differential amplifier circuitry formed on a semiconductor substrate with a rewiring technique.

2. Description of the Prior Art

FIG. 12 shows a circuit diagram of high-frequency differential amplifier circuitry according to a prior art (See Japanese Patent Laid-Open Publication No. JP-2003-133862-A). Referring to FIG. 12, the high-frequency differential amplifier circuitry is configured by transistors Q1 and Q2, a bias circuit 103, resistors 104 and 105, pads 201, 203 and 204, CSP (Chip Size Package) output terminals 205, 207 and 208, and input terminals IN1 and IN2. The transistors Q1 and Q2 constitute a differential pair of the differential amplifier circuit. The bias circuit 103 generates a predetermined bias current, and supplies the bias current to a base of the transistor Q1 via the resistor 104 and to a base of the transistor Q2 via the resistor 105 so as to control the biased states of the transistors Q1 and Q2, respectively. The CSP output terminal 205 is connected with emitters of the transistors Q1 and Q2 via the pad 201 and a parasitic inductance L1. The CSP output terminals 207 and 208 are connected with collectors of the transistors Q1 and Q2 via the pads 203 and 204, respectively.

In the high-frequency differential amplifier circuitry according to the prior art configured as described above, when differential signals are inputted to the respective bases of the transistors Q1 and Q2 via the input terminals IN1 and IN2, the respective differential signals amplified by the differential pair, which is constituted by the transistors Q1 and Q2, are outputted from the collectors of the transistors Q1 and Q2 via the output terminals 207 and 208.

However, due to the parasitic inductance component L1 caused by rewiring to form the above-mentioned high-frequency differential amplifier circuitry according to the prior art on a semiconductor substrate, the emitters of the transistors Q1 and Q2 come into a common impedance state, which generates a higher-harmonic wave having frequencies, such as two times, three times and the like, as high as that of the differential signals inputted to the emitters of the transistors Q1 and Q2. Thus, a problem is created in that the higher-harmonic wave interferes with input signals and deteriorates distortion characteristics of the differential amplifier circuitry.

An additional problem is created in that the resistors 104 and 105 for biasing the bases of the transistors Q1 and Q2 attenuate the input signals, which causes a gain reduction.

Furthermore, in the case of forming the high-frequency differential amplifier circuitry on one chip with a modem circuit part and a frequency synthesizer part, there is still a further problem in that signals from the respective circuits interfere with one another via a semiconductor substrate, which causes characteristic deterioration such as generation of spurious signals and deterioration of noise and the like. For example, in the case of forming a transmission driver amplifier on one chip with the modem circuit part and the frequency synthesizer part, the frequency of the oscillator might be shifted when an output signal of the transmission driver amplifier leaks into and interferes with the oscillator. Otherwise, carrier leakage might occur when a local oscillation signal, inputted to a modulator, directly leaks into the transmission driver amplifier, which causes deterioration of modulation accuracy.

SUMMARY OF THE INVENTION

It is an essential object of the present invention to solve the above-mentioned problems, and to provide differential amplifier circuitry and a radio communication apparatus that is capable of improving the distortion characteristics and gains, and has less characteristic deterioration due to signal interference between the differential amplifier circuitry and the other circuits formed on the same semiconductor substrate, as compared with the differential amplifier circuitry according to the prior art.

According to a first aspect of the present invention, there is provided differential amplifier circuitry formed on a semiconductor substrate. The differential amplifier circuitry includes first and second transistors, first and second pads, first and second external ground terminals, and first and second rewiring layers. The first and second transistors constitute a differential pair of the differential amplifier circuitry. The first and second pads are connected with emitters or sources of the first and second transistors, respectively. The first and second rewiring layers connect the first and second pads with the first and second external ground terminals to ground the first and second pads, respectively.

In addition, in the differential amplifier circuitry, the first and second rewiring layers are connected with each other.

Further, the differential amplifier circuitry further includes first and second bias circuits. The first and second bias circuits are connected with ones of bases and gates of the first and second transistors via first and second resistors, respectively.

In addition, the differential amplifier circuitry further includes third and fourth pads. The third and fourth pads are connected with ones of collectors and drains of the first and second transistors, respectively. In addition in the differential amplifier circuitry, the third pad, the first transistor, the first pad, the first resistor and the first bias circuit are formed to be adjacent to one another so as to constitute a first cell. Further in the differential amplifier circuitry, the fourth pad, the second transistor, the second pad, the second resistor and the second bias circuit are formed to be adjacent to one another so as to constitute a second cell. Still further in the differential amplifier circuitry, the first cell and the second cell are substantially formed in line symmetry.

Further, the differential amplifier circuitry further includes a subcontact part formed about the circumference of the first and second cells.

Still further, the differential amplifier circuitry further includes a fifth pad, a third external ground terminal and a third rewiring layer. The fifth pad is connected with the subcontact part. The third rewiring layer connects the fifth pad with the third external ground terminal to ground the fifth pad.

According to a second aspect of the present invention, there is provided a radio communication apparatus including at least one of a transmitter circuit and a receiver circuit. The transmitter circuit includes a first amplifier for amplifying a radio signal, and the transmitter circuit is operable to transmit the radio signal amplified by the first amplifier. The receiver circuit includes a second amplifier for amplifying a radio signal, and is operable to receive the radio signal amplified by the second amplifier. In addition in the radio communication apparatus, at least one of the first and second amplifiers is differential amplifier circuitry formed on a semiconductor substrate. Further in the radio communication apparatus, the differential amplifier circuitry includes first and second transistors, first and second pads, first and second external ground terminals and first and second rewiring layers. The first and second transistors constitute a differential pair of the differential amplifier circuitry. The first and second pads are connected with ones of emitters and sources of the first and second transistors, respectively. The first and second rewiring layers connect the first and second pads with the first and second external ground terminals to ground the first and second pads, respectively.

According to the differential amplifier circuitry and the radio communication apparatus according to the present invention, the distortion characteristics and gains can be improved, and characteristic deterioration due to signal interference between the differential amplifier circuitry and the other circuits formed on the same semiconductor substrate can be reduced, as compared with the prior art differential amplifier circuitry.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DESCRIPTION OF THE PREFERRED EMBODIMENTS

Figure 1:
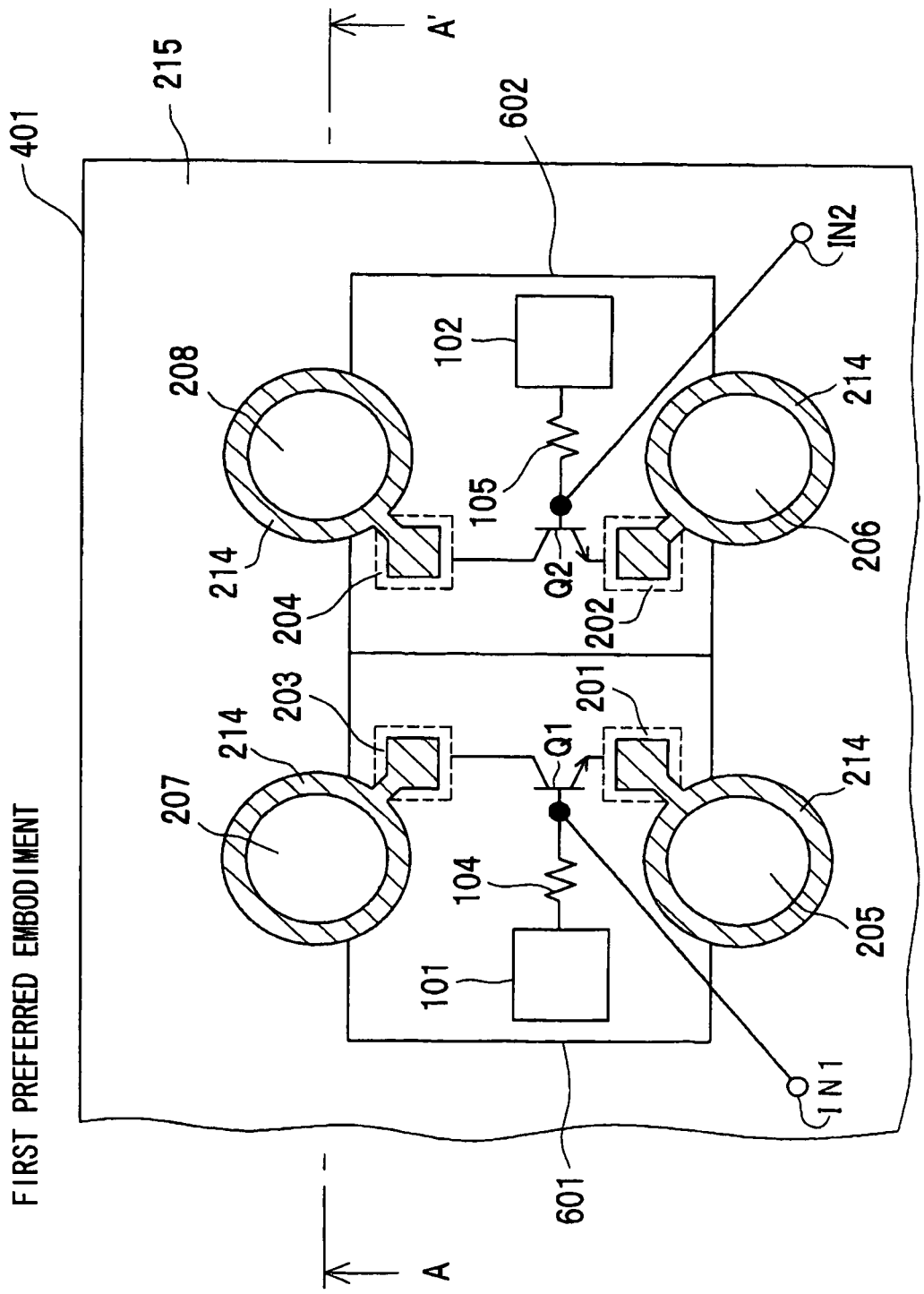
FIG. 1 is a schematic plan view showing a configuration of a high-frequency differential amplifier circuitry according to a first preferred embodiment of the present invention.

The preferred embodiments according to the present invention will be described below with reference to the attached drawings. In the drawings, the same reference numerals denote similar components or the like.

First Preferred Embodiment

FIG. 1 is a schematic plan view showing a configuration of high-frequency differential amplifier circuitry according to a first preferred embodiment of the present invention. FIG. 1 shows a state in which a resin 213 (See FIG. 2) is not formed on a semiconductor substrate 401. The high-frequency differential amplifier circuitry according to the first preferred embodiment is formed on the semiconductor substrate 401 having a chip size package, which forms a rewiring layer on the chip. Referring to FIG. 1, the high-frequency differential amplifier circuitry is configured by including transistors Q1 and Q2, bias circuits 101 and 102, resistors 104 and 105, pads 201, 202, 203 and 204, CSP (chip size package) output terminals 205, 206, 207 and 208, and input terminals IN1 and IN2. The transistors Q1 and Q2 constitute a differential pair. Bases of the transistors Q1 and Q2 are connected with the resistors 104 and 105, respectively, collectors thereof are connected with the pads 203 and 204, respectively, and emitters thereof are connected with the pads 201 and 202, respectively. Further, the bases of the transistors Q1 and Q2 are connected with the input terminals IN1 and IN2, respectively. Ends of the resistors 104 and 105 are connected with the bases of the transistors Q1 and Q2, respectively, and the other ends thereof are connected with the bias circuits 101 and 102, respectively. The CSP output terminals 205, 206, 207 and 208 are connected with the pads 201, 202, 203 and 204, respectively, via a rewiring layer 214 serving as a conductor, and are used as external terminals. In this case, the CSP output terminals 205 and 206 are grounded. The respective bias circuits 101 and 102 generate predetermined bias currents, and supply the bias currents to the bases of the transistors Q1 and Q2 via the resistors 104 and 105 so as to control the biased states of the transistors Q1 and Q2, respectively.

Further, in FIG. 1, the pads 201 and 203, the transistor Q1, the resistor 104 and the bias circuit 101 are formed to be adjacent to one another so as to constitute a cell 601, and also the pads 202 and 204, the transistor Q2, the resistor 105 and the bias circuit 102 are formed to be adjacent to one another so as to constitute a cell 602. The cell 601 and the cell 602 are formed in line symmetry to be adjacent to each other.

In the high-frequency differential amplifier circuitry according to the first preferred embodiment, which is configured as described above, when differential signals are inputted to the respective bases of the transistors Q1 and Q2 via the input terminals IN1 and IN2, the differential signals amplified by the differential pair, which is constituted by the transistors Q1 and Q2, are outputted from the respective collectors of the transistors Q1 and Q2 via the output terminals 207 and 208, respectively.

Figure 2:
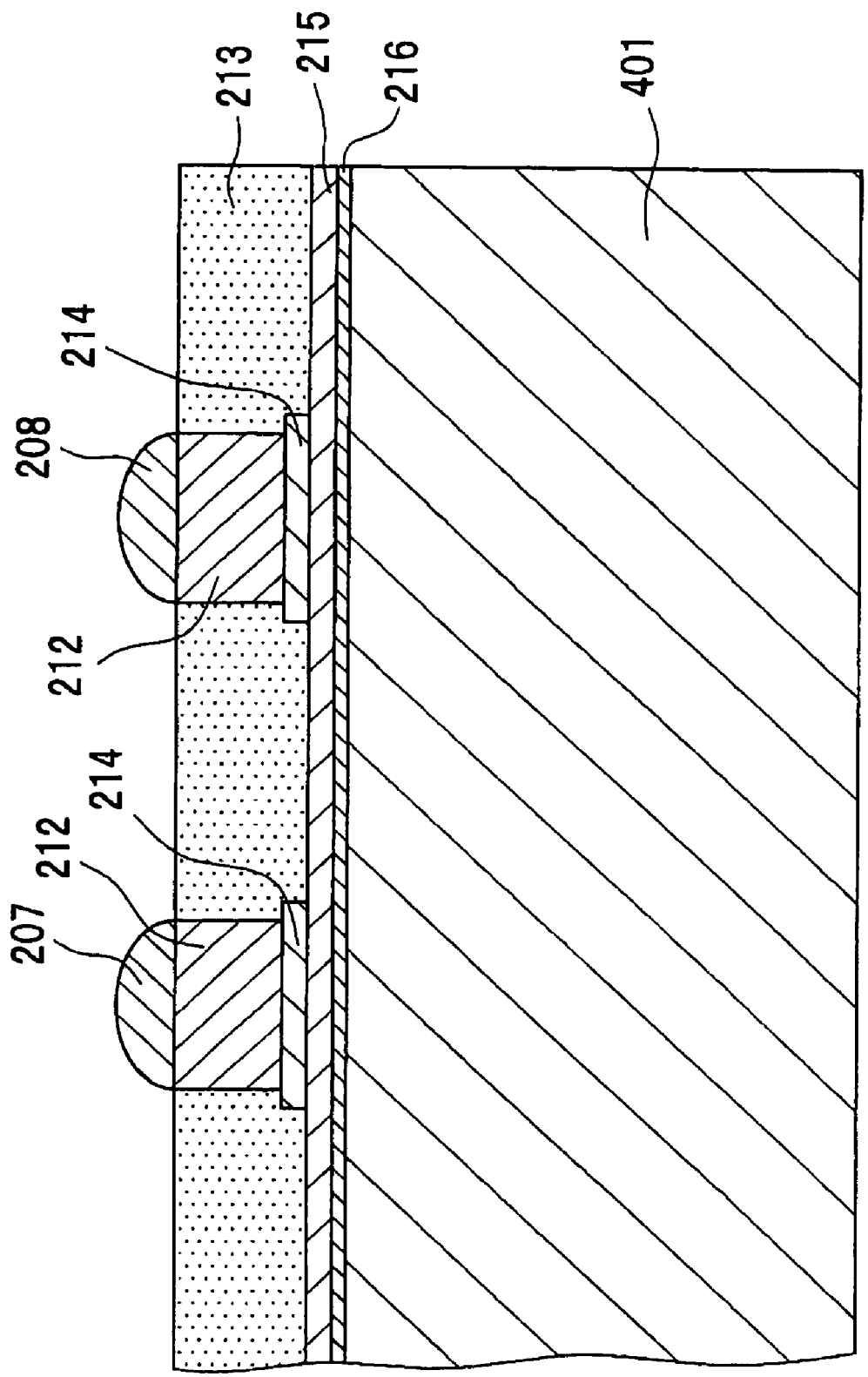
FIG. 2 is a cross-sectional view taken along line A-A' of FIG. 1.

FIG. 2 is a cross-sectional view taken along line A-A' of FIG. 1. Referring to FIG. 2, a protective layer 216 and a polyimide layer 215 are laminated on the semiconductor substrate 401 in this order. The protective layer 216 is made of an insulating film layer such as a silicon oxide film, a silicon nitride film or the like. Further, the rewiring layer 214 is formed on one part of the polyimide layer 215, a copper post 212 is formed on the rewiring layer 214, and the copper post 212 is connected with the CSP output terminals 207 and 208 located at the top. The circumferences of the rewiring layer 214 and the copper post 212 are filled with the resin 213.

Figure 3:
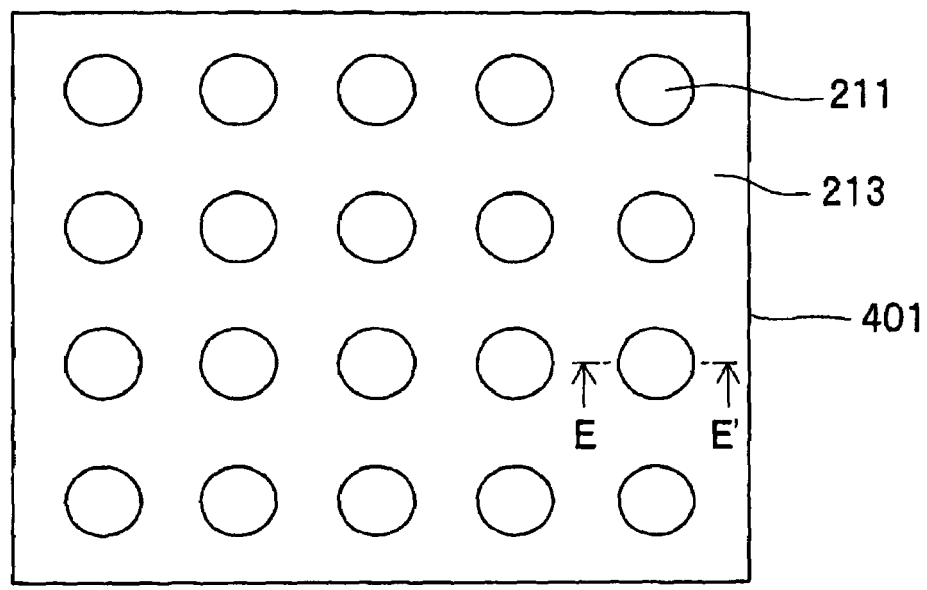
FIG. 3 is a plan view showing a surface of terminals of a semiconductor substrate of a wafer-level chip size package of the high-frequency differential amplifier circuitry of FIG. 1.
Figure 4:
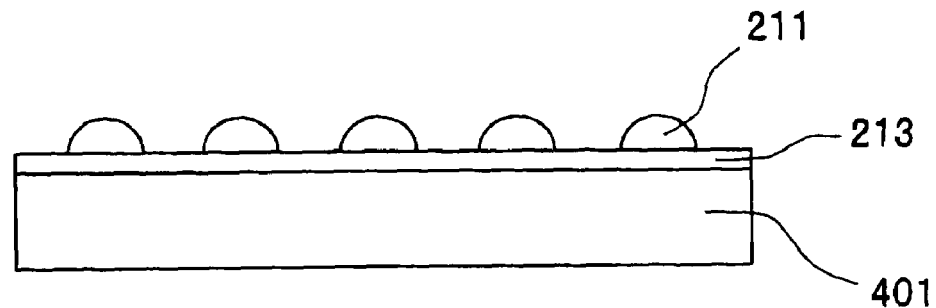
FIG. 4 is a side view of the semiconductor substrate of FIG. 3.
Figure 5:
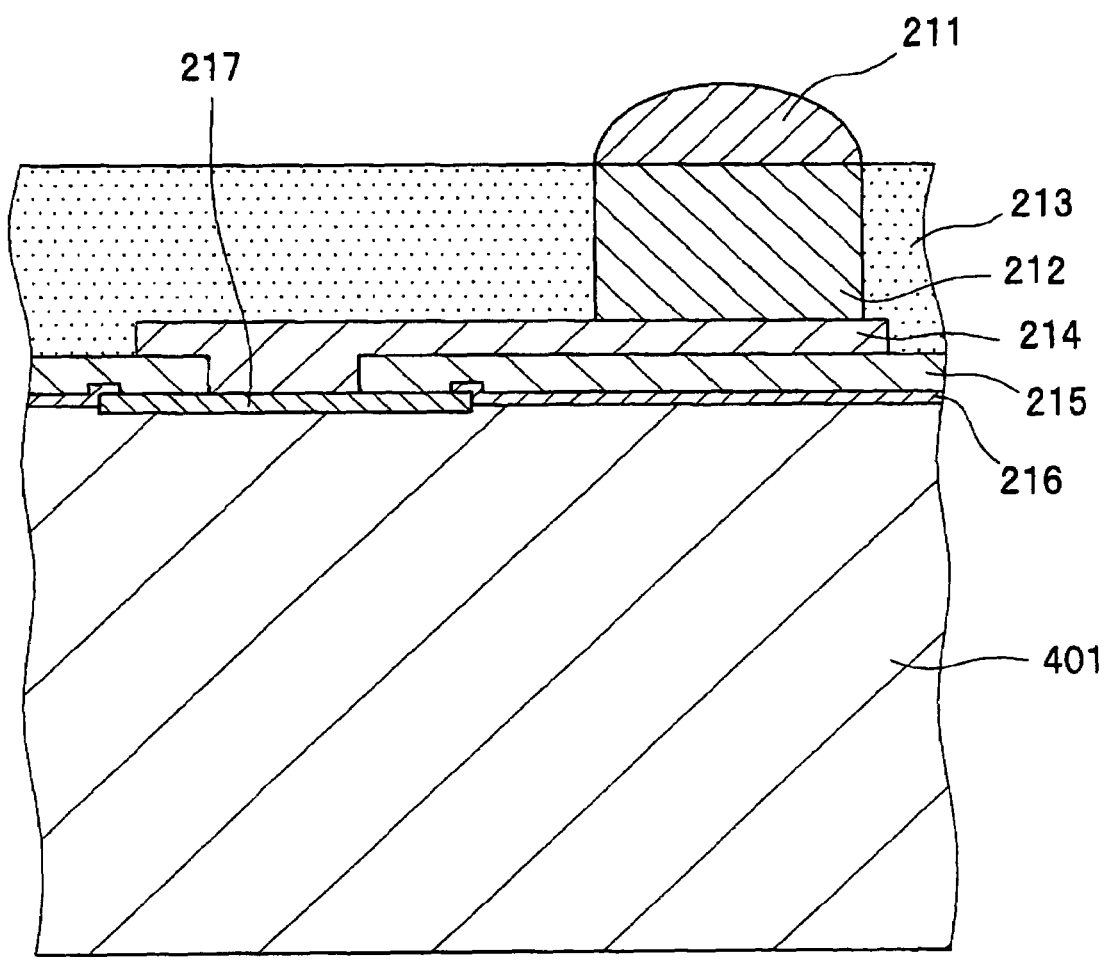
FIG. 5 is a cross-sectional view taken along line E-E' of FIG. 3.

FIG. 3 is a plan view showing a surface of terminals of a semiconductor substrate 401 of a wafer-level chip size package of the high-frequency differential amplifier circuitry of FIG. 1. FIG. 4 is a side view showing the semiconductor substrate 401 of FIG. 3. As shown in FIGS. 3 and 4, in the wafer-level chip size package, the resin 213 is formed on the semiconductor substrate 401, and a plurality of solder balls 211 is aligned on the surface of the resin 213. It is noted that the polyimide layer 215 and the protective layer 216 formed between the resin 213 and the semiconductor substrate 401 are not shown in FIG. 4 in order to simplify the drawing. FIG. 5 is a cross-sectional view taken along line E-E' of FIG. 3. As shown in FIG. 5, an aluminum pad 217, the protective layer 216, the polyimide layer 215 and the rewiring layer 214 are formed on the semiconductor substrate 401. The aluminum pad 217 is connected with the rewiring layer 214, and is used as the pads 201, 202, 203, 204 and the like of FIG. 1. The rewiring layer 214 extends to a location beneath the positions of the solder balls 211, and the copper post 212 is formed on the rewiring layer 214. The solder balls 211 are formed on the copper post 212. The solder balls 211 are used as the CSP output terminals 205, 206, 207 and 208 of FIG. 1.

According to the high-frequency differential amplifier circuitry having the configuration described above, a parasitic inductance component (not shown) due to the rewiring layer 214 and the copper post 212 exists between the pad 201 and the CSP output terminal 205 and between the pad 202 and the CSP output terminal 206. However, since the respective emitters of the transistors Q1 and Q2 are grounded independently, and the emitters thereof do not form any common impedance. Therefore, it is possible to suppress deterioration of distortion characteristics without generating of any amplitude components such as a secondary higher-harmonic wave and the like.

Further, according to the high-frequency differential amplifier circuitry having the configuration described above, the resistors 104 and 105 connected with the bases of the transistors Q1 and Q2, respectively, are not connected with one common bias circuit but are connected with two independent bias circuits 101 and 102, respectively. Therefore, since no resistance exists between the bases of the transistors Q1 and Q2, it is possible to suppress attenuation of input signals, and this leads to improvement in the gain.

Second Preferred Embodiment

Figure 6:
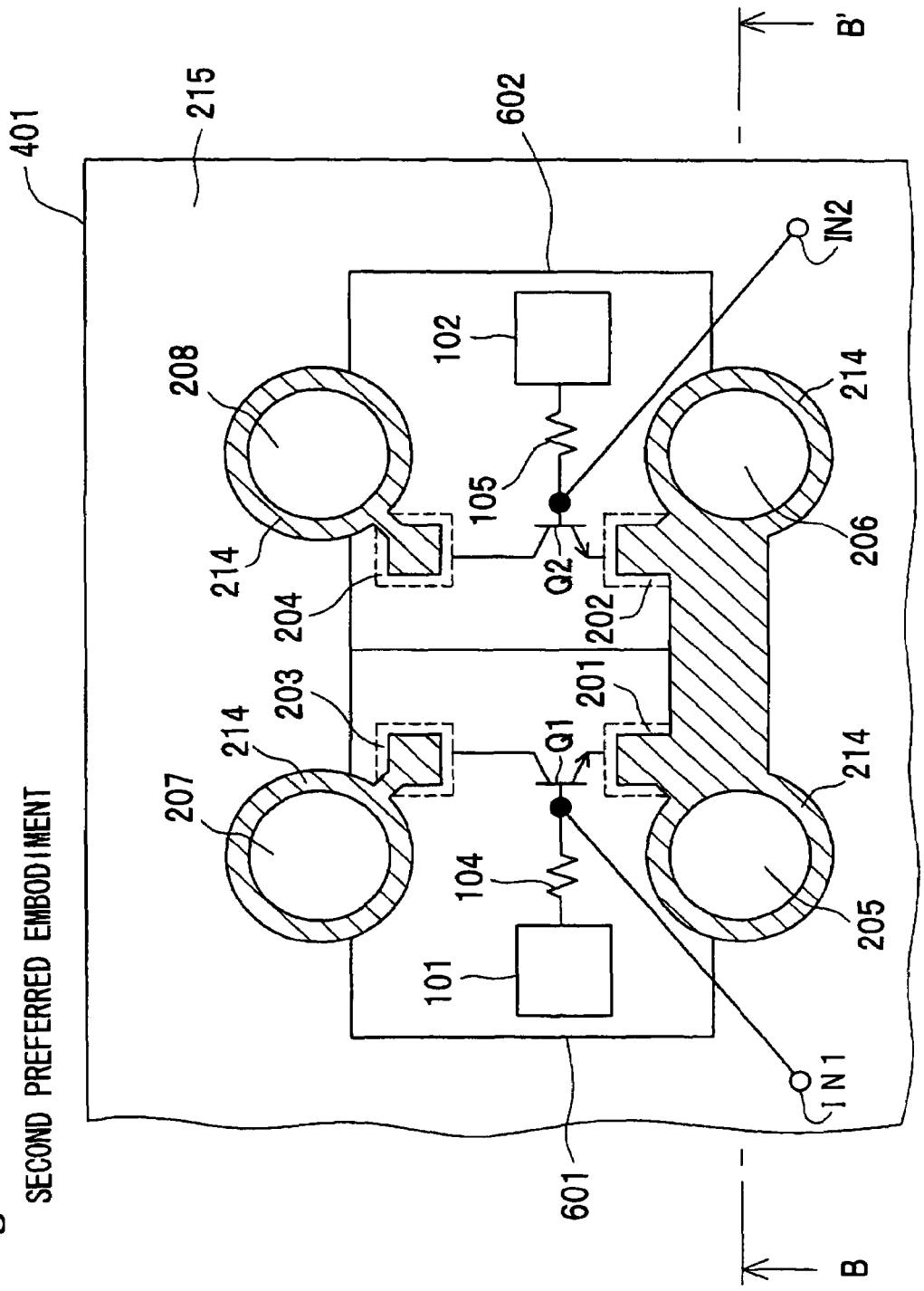
FIG. 6 is a schematic plan view showing a configuration of high-frequency differential amplifier circuitry according to a second preferred embodiment of the present invention.

FIG. 6 is a schematic plan view showing a configuration of a high-frequency differential amplifier circuitry according to a second preferred embodiment of the present invention. As shown in FIG. 6, the high-frequency differential amplifier circuitry according to the second preferred embodiment is different from that of the first preferred embodiment shown in FIG. 1 in that the CSP output terminals 205 and 206 are connected with each other via the rewiring layer 214. The other aspects are similar to those of the high-frequency differential amplifier circuitry according to the first preferred embodiment of FIG. 1, and detailed descriptions of the components that are denoted by the same reference numerals as those of FIG. 1 are omitted.

Figure 7:
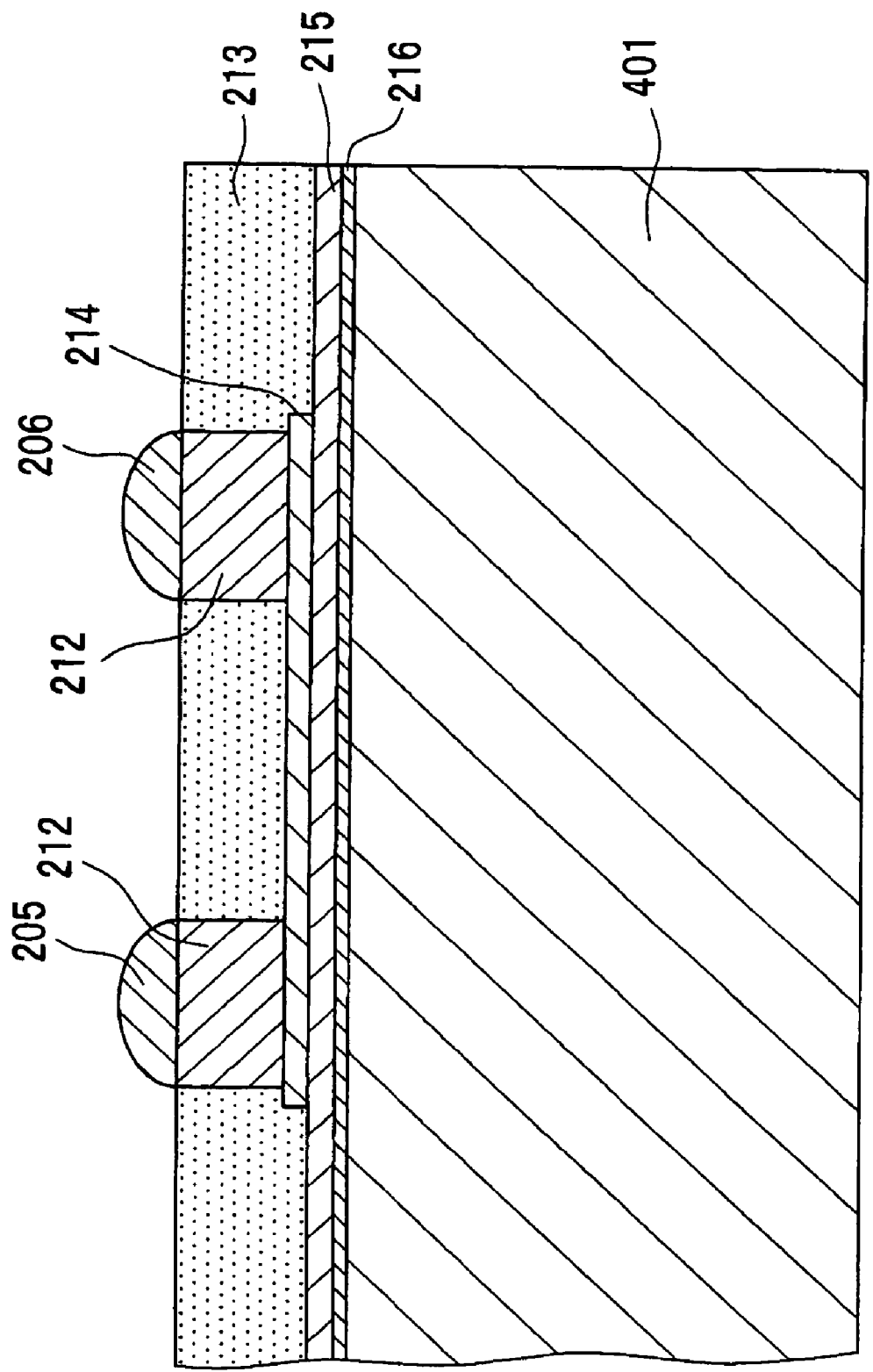
FIG. 7 is a cross-sectional view taken along line B-B' of FIG. 6.

FIG. 7 is a cross-sectional view taken along line B-B' of FIG. 6. Referring to FIG. 7, the CSP output terminals 205 and 206 are connected with each other via the copper post 212, which is formed beneath the respective CSP output terminals 205 and 206, and the rewiring layer 214.

According to the high-frequency differential amplifier circuitry having the configuration described above, since the two CSP output terminals 205 and 206 are grounded by the rewiring layer 214, it is possible to maintain the rewiring layer 214 at a low impedance, and thus a parasitic inductance component (not shown) between the pads 201 and 202 and the rewiring layer 214 serving as a spreading solid grounding conductor can be suppressed. Therefore, it is possible to suppress deterioration of distortion characteristics due to a common impedance between the emitters of the transistors Q1 and Q2 in a manner similar to that of the high-frequency differential amplifier circuitry according to the first preferred embodiment shown in FIG. 1.

Third Preferred Embodiment

Figure 8:
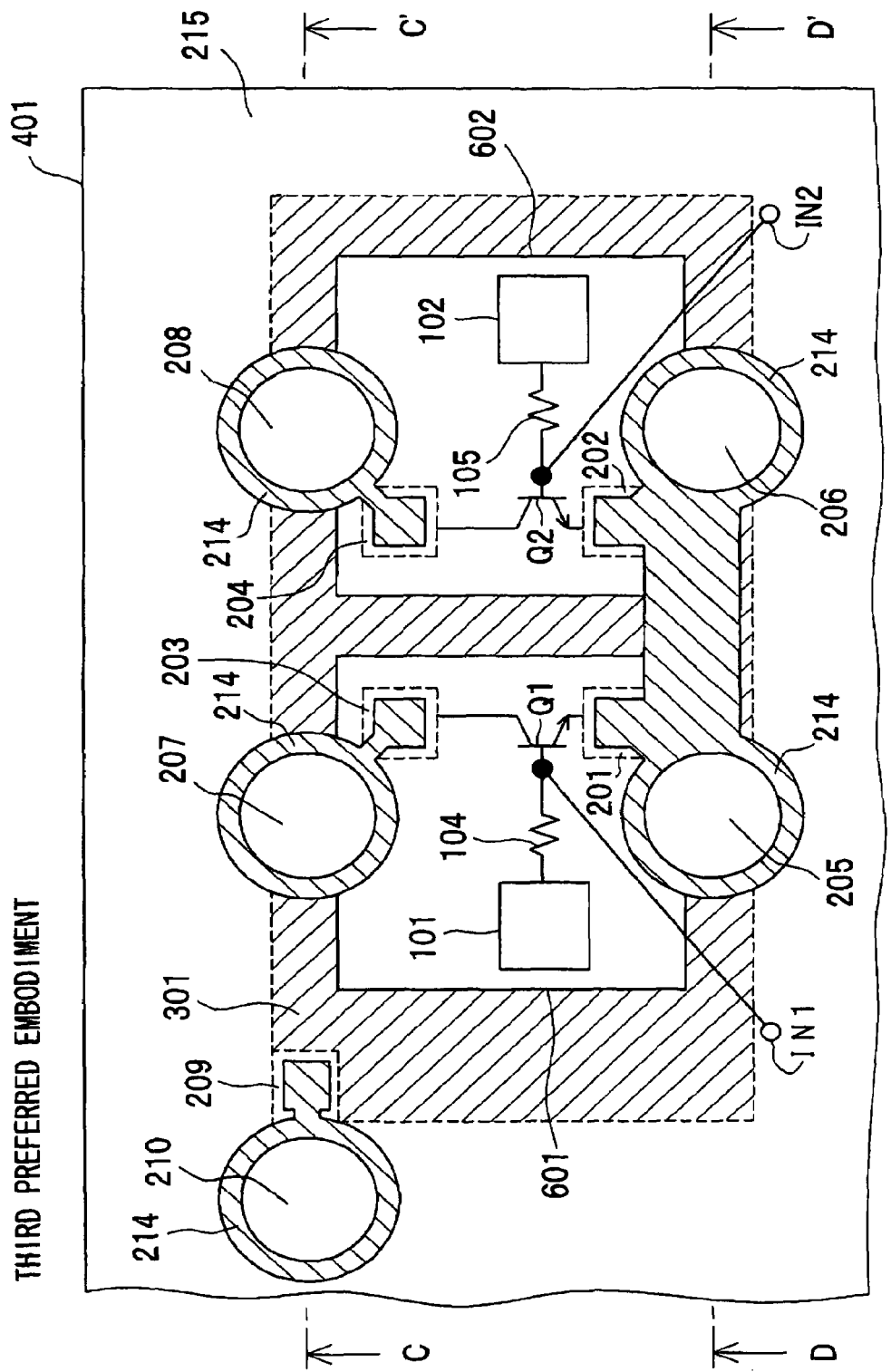
FIG. 8 is a schematic plan view showing a configuration of high-frequency differential amplifier circuitry according to a third preferred embodiment of the present invention.

FIG. 8 is a schematic plan view showing a configuration of high-frequency differential amplifier circuitry according to a third preferred embodiment of the present invention. As shown in FIG. 8, the high-frequency differential amplifier circuitry according to the third preferred embodiment is different from that of the second preferred embodiment shown in FIG. 6 in that the subcontact 301 is formed about the circumference of and between the cells 601 and 602, and that a pad 209 and a CSP output terminal 210 are additionally formed. The other aspects are similar to those of the high-frequency differential amplifier circuitry of the second preferred embodiment of FIG. 6, and detailed descriptions of components that are denoted by the same reference numerals as those of FIG. 6 are omitted.

Referring to FIG. 8, the subcontact 301 is a grounding conductor, surrounds the cell 601 and the cell 602, and is connected with the pad 209. The CSP output terminal 210 is connected with the subcontact 301 via the rewiring layer 214 and the pad 209. By grounding the CSP output terminal 210, the subcontact 301 is also grounded. The subcontact 301 is made of, for example, a metallic wiring layer, an impurity diffusion layer or the like (See FIG. 9).

Figure 9:
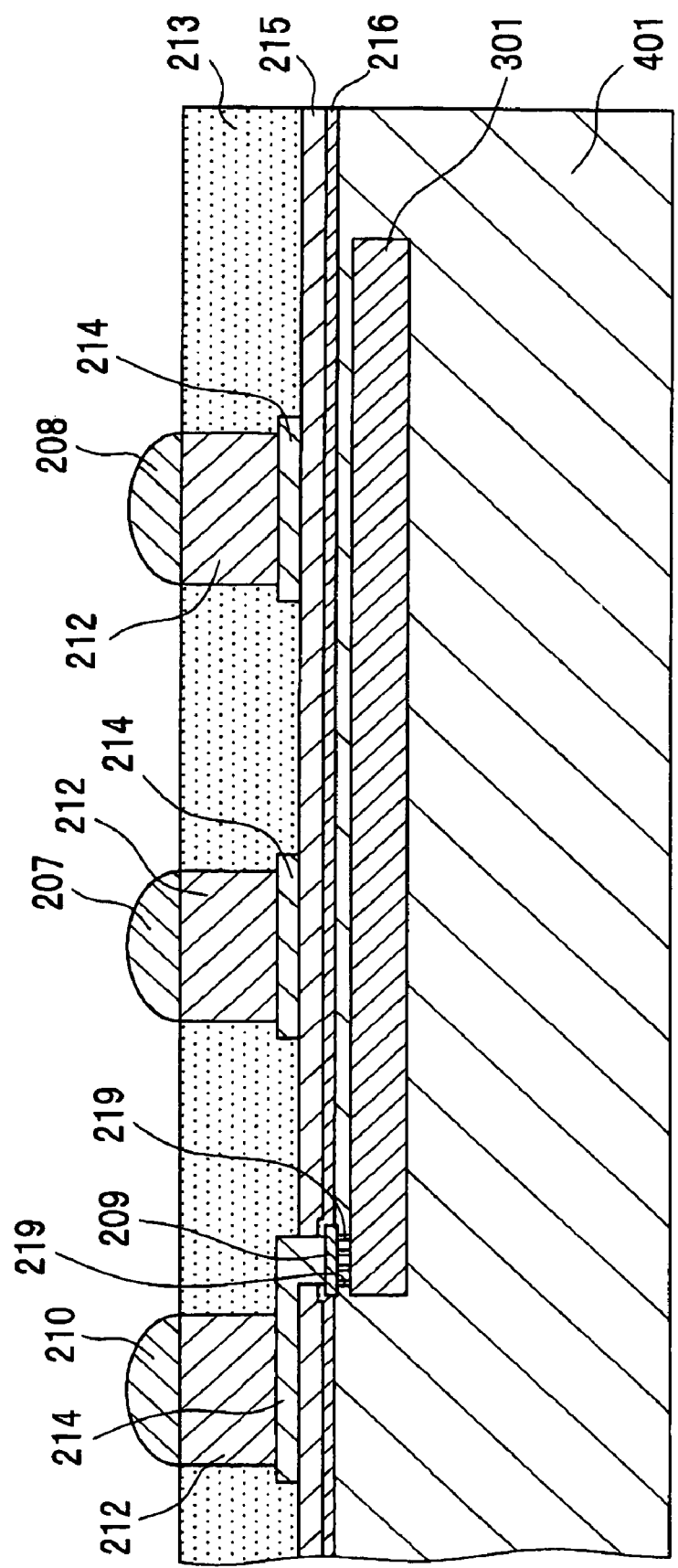
FIG. 9 is a cross-sectional view taken along line C-C' of FIG. 8.

FIG. 9 is a cross-sectional view taken along line C-C' of FIG. 8. Referring to FIG. 9, the subcontact 301 is formed inside of the semiconductor substrate 401. The protective layer 216, the polyimide layer 215 and the rewiring layer 214 are formed on the semiconductor substrate 401. The protective layer 216 is made of, for example, an insulating film layer such as a silicon oxide film, a silicon nitride film or the like. The pad 209 is connected with the subcontact 301 through a via conductor as filled in a plurality of via holes 219 penetrating in a thickness direction to be grounded. The rewiring layer 214 connected with the pad 209 extends to a location beneath the CSP output terminal 210, and the copper post 212 is formed on the rewiring layer 214. The copper post 212 is connected with the CSP output terminal 210 located at the top. The circumference of the rewiring layer 214 and the copper post 212 are surrounded by the resin 213. The structure in the vicinity of CSP output terminals 207 and 208 is similar to that of the high-frequency differential amplifier circuitry of the first preferred embodiment shown in the cross-sectional view of FIG. 2, and detailed descriptions thereof are omitted.

Figure 10:
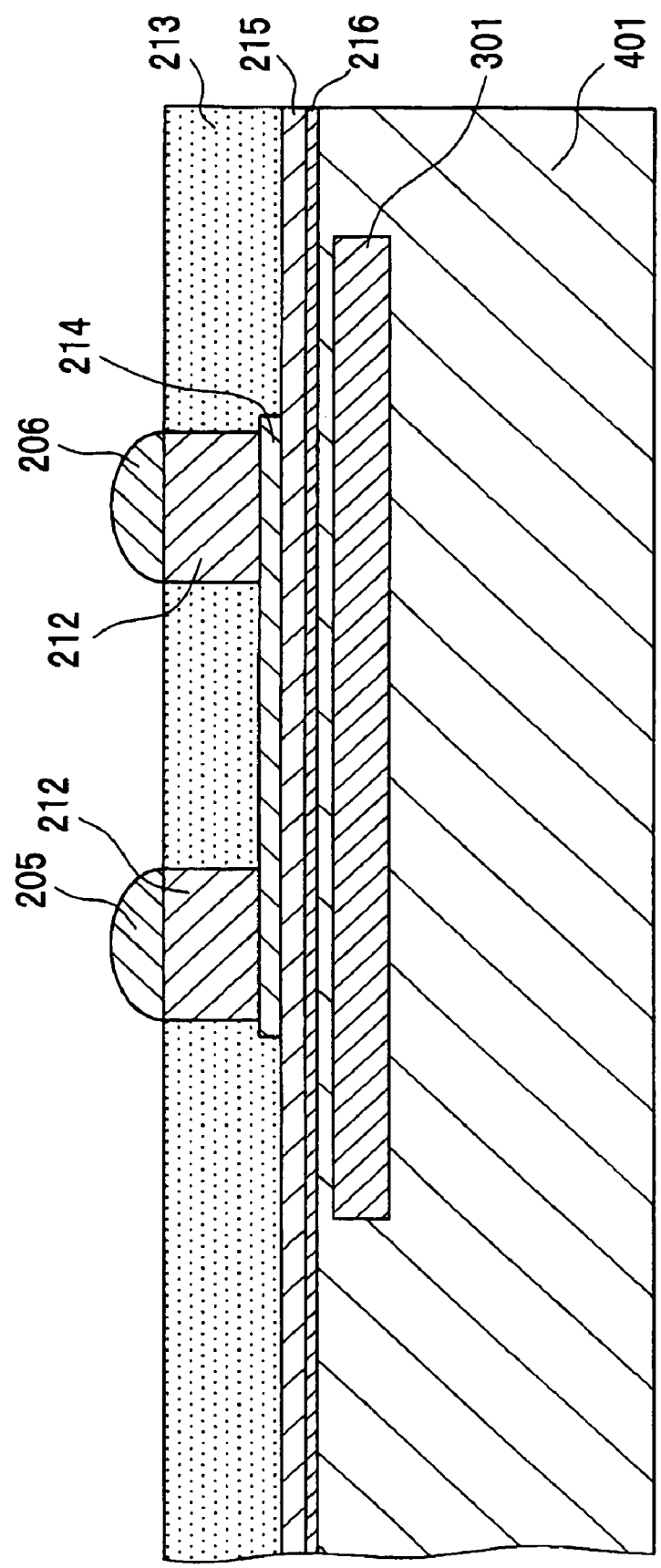
FIG. 10 is a cross-sectional view taken along line D-D' of FIG. 8.

FIG. 10 is a cross-sectional view taken along line D-D' of FIG. 8. Referring to FIG. 10, the subcontact 301 is formed inside of the semiconductor substrate 401. The other respects are similar to those of the high-frequency differential amplifier circuitry according to the second preferred embodiment shown in the cross-sectional view of FIG. 7, and detailed descriptions thereof are omitted.

According to the high-frequency differential amplifier circuitry configured as described above, by forming the subcontact 301 serving as a grounding conductor so that the subcontact 301 surrounds the transistors Q1 and Q2, the pads 201, 202, 203 and 204, the resistors 104 and 105, and the bias circuits 101 and 102, then, the surrounding of the high-frequency differential amplifier circuitry is maintained at a low impedance by the subcontact 301 and is electromagnetically shielded by the subcontact 301 serving as the grounding conductor. Therefore, even if signal interference is caused between the high-frequency differential amplifier circuitry and one of the other circuits such as a modem circuit part, a frequency synthesizer part and the like via the semiconductor substrate 401, leakage of the signals into the high-frequency differential amplifier circuitry is reduced.

In addition, since the interference suppression effect of the signals becomes larger as the area of the subcontact 301 is larger, it is preferred that the area of the subcontact 301 is made as large as possible. Further, by grounding the subcontact 301 via the pad 209 and the CSP output terminal 210, the interference suppression effect can be larger than that of the first and second preferred embodiments. In this case, the pad 209 is desirably connected with the CSP output terminal 210 so as to be located with the subcontact 301 as close as possible with a distance as short as possible. In the present preferred embodiment, there are provided only one pad 209 and only one CSP output terminal 210. However, the present invention is not limited to this configuration. The subcontact 301 may be connected with a plurality of pads 209 and a plurality of CSP output terminals 210. In this case, the interference suppression effect can be made larger.

Further in the first to third preferred embodiments described above, bipolar transistors are used as the transistors Q1 and Q2, respectively. However, the present invention is not limited to this configuration, and source-grounded differential amplifier circuitry may be configured with field effect transistors instead of the bipolar transistors.

Fourth Preferred Embodiment

Figure 11:
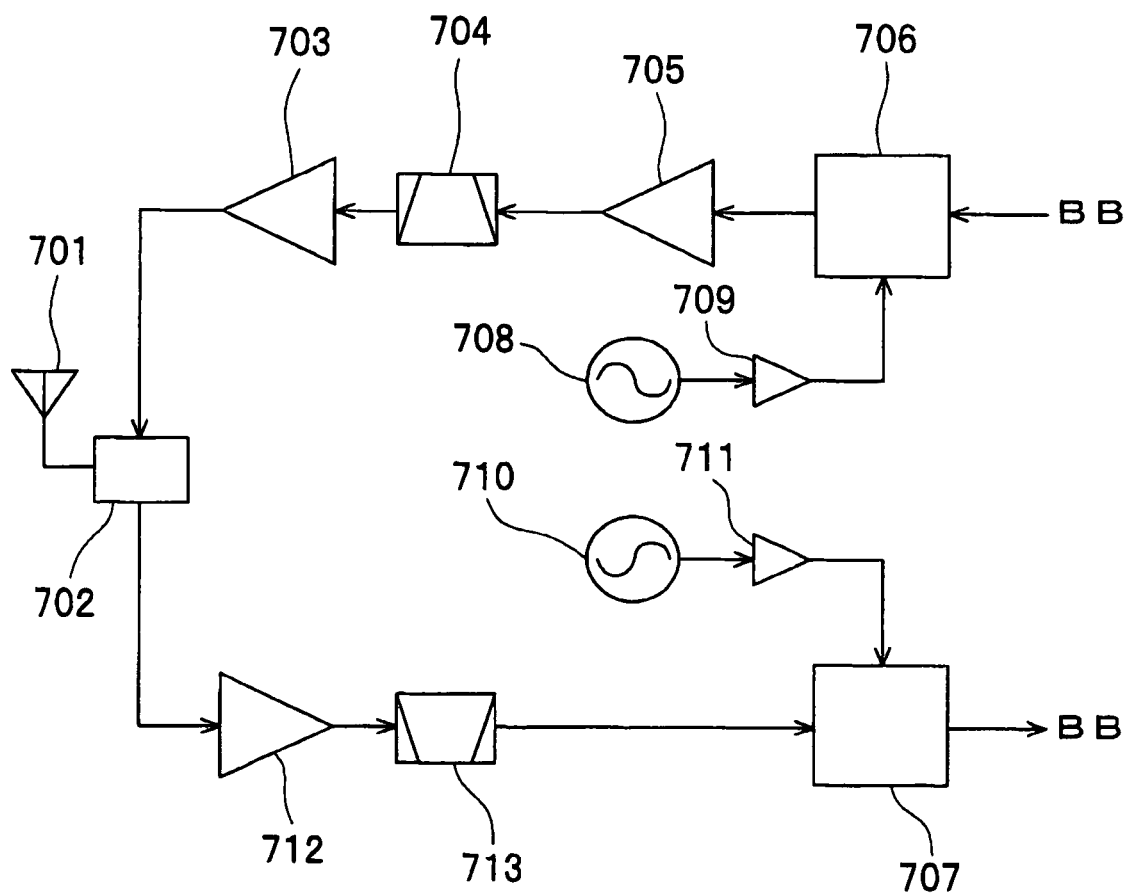
FIG. 11 is a block diagram showing a configuration of a radio communication apparatus according to a fourth preferred embodiment of the present invention.
Figure 12:
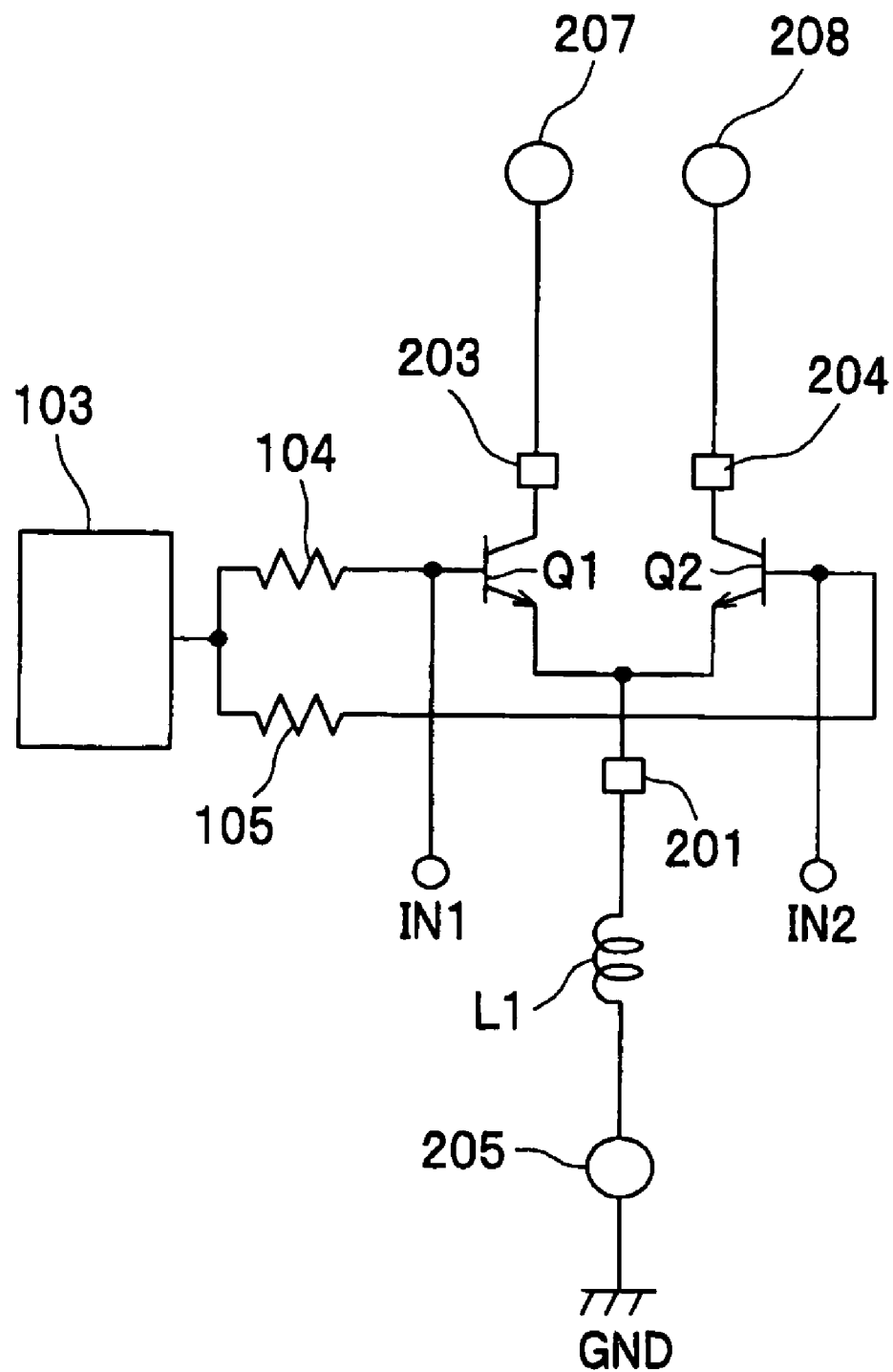
FIG. 12 is a circuit diagram showing a configuration of a high-frequency differential amplifier circuitry according to the prior art.

FIG. 11 is a block diagram showing a circuit configuration of a radio communication apparatus according to a fourth preferred embodiment of the present invention. The radio communication apparatus shown in FIG. 11 is configured by including an antenna 701, a duplexer 702, a power amplifier 703, band-pass filters 704 and 713, a drive amplifier 705, a modulator 706, a demodulator 707, local oscillators 708 and 710, local amplifiers 709 and 711, and a low noise amplifier 712. The transmission driver amplifier 705, the low noise amplifier 712 and the power amplifier 703 include high-frequency differential amplifier circuitries as described in any one of the first to third preferred embodiments, respectively. In this case, the power amplifier 703, the band-pass filter 704, the driver amplifier 705, the modulator 706, the local oscillator 708 and the local amplifier 709 constitute a transmitter circuit. The demodulator 707, the low noise amplifier 712, the band-pass filter 713, the local oscillator 710 and the local amplifier 711 constitute a receiver circuit.

In the radio communication apparatus of FIG. 11, upon transmitting, the modulator 706 modulates a local oscillation signal that is generated by the local oscillator 708 and amplified by the local amplifier 709, in accordance with an inputted baseband signal, and outputs the modulated signal to the band-pass filter 704 via the transmission driver amplifier 705. The band-pass filter 704 removes unnecessary frequency components from the output signal of the modulator 706 that is amplified by the transmission driver amplifier 705, and band-pass-filters a radio transmitting signal to be transmitted, and outputs the filtered signal to the duplexer 702 via the power amplifier 703. The duplexer 702 transmits the inputted radio transmitting signal by the antenna 701.

Further, in the radio communication apparatus of FIG. 11, upon receiving, the duplexer 702 outputs a radio receiving signal received by the antenna 701 to the band-pass filter 713 via the low noise amplifier 712. The band-pass filter 713 removes unnecessary frequency components from the inputted radio receiving signal, and band-pass-filters a received radio signal, and outputs the filtered signal to the demodulator 707. The demodulator 707 converts the received radio signal into a predetermined intermediate frequency signal by low-frequency-conversion using a local oscillation signal that is generated by the local oscillator 710 and amplified by the local amplifier 711, and then, demodulates the converted signal to a baseband signal and outputs the demodulated signal.

Since the transmission driver amplifier 705, the low noise amplifier 712 and the power amplifier 703 include the high-frequency differential amplifier circuitries as described in any one of the first to third preferred embodiments, it is possible to reduce carrier leakage due to the local oscillation signal, generated by the local oscillator 708 and amplified by the local amplifier 709, from leaking into the transmission driver amplifier 705 via a semiconductor substrate. Accordingly, deterioration of modulation precision can be prevented, and spurious signals, noises and the like due to the interference from the other circuits can also be reduced.

According to the radio communication apparatus of the present preferred embodiment, it is possible to realize a radio communication apparatus having better radio characteristics with low noise and low distortion by utilizing the high-frequency differential amplifier circuitries according to the first to third preferred embodiments, in the transmission driver amplifier 705, the low noise amplifier 712 and the power amplifier 703.

The high-frequency differential amplifier circuitry according to the present invention can be used as a transmission driver amplifier, a low noise amplifier and the like in a semiconductor integrated circuit for communications.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. Differential amplifier circuitry formed on a semiconductor substrate, the differential amplifier circuitry comprising:
    first and second transistors constituting a differential pair of the differential amplifier circuitry;
    first and second pads connected with emitters or sources of the first and second transistors, respectively;
    first and second external ground terminals; and
    first and second rewiring layers for connecting the first and second pads with the first and second external ground terminals to ground the first and second pads, respectively.

2. The differential amplifier circuitry as claimed in claim 1, wherein the first and second rewiring layers are connected with each other.

3. The differential amplifier circuitry as claimed in claim 1, further comprising first and second bias circuits connected with ones of bases and gates of the first and second transistors via first and second resistors, respectively.

4. The differential amplifier circuitry as claimed in claim 2, further comprising first and second bias circuits connected with ones of bases and gates of the first and second transistors via first and second resistors, respectively.

5. The differential amplifier circuitry as claimed in claim 3, further comprising third and fourth pads connected with ones of collectors and drains of the first and second transistors, respectively,
   wherein the third pad, the first transistor, the first pad, the first resistor and the first bias circuit are formed to be adjacent to one another so as to constitute a first cell,
   wherein the fourth pad, the second transistor, the second pad, the second resistor and the second bias circuit are formed to be adjacent to one another so as to constitute a second cell, and
   wherein the first cell and the second cell are substantially formed in line symmetry.

6. The differential amplifier circuitry as claimed in claim 5, further comprising a subcontact part formed about the circumferences of the first and second cells.

7. The differential amplifier circuitry as claimed in claim 6, further comprising:
   a fifth pad connected with the subcontact part;
   a third external ground terminal; and
   a third rewiring layer for connecting the fifth pad with the third external ground terminal to ground the fifth pad.

8. A radio communication apparatus comprising at least one of a transmitter circuit including a first amplifier for amplifying a radio signal and transmitting the radio signal amplified by the first amplifier and a receiver circuit including a second amplifier for amplifying a radio signal and receiving the radio signal amplified by the second amplifier,
   wherein at least one of the first and second amplifiers is a differential amplifier circuitry formed on a semiconductor substrate, and
   wherein the differential amplifier circuitry comprises:
   first and second transistors constituting a differential pair of the differential amplifier circuitry;
   first and second pads connected with ones of emitters and sources of the first and second transistors, respectively;
   first and second external ground terminals; and
   first and second rewiring layers for connecting the first and second pads with the first and second external ground terminals to ground the first and second pads, respectively.

* * * * *